US012789233B2

(12) United States Patent
Hielscher et al.

(10) Patent No.: US 12,789,233 B2
(45) Date of Patent: Nov. 10, 2026

(54) DEVICE FOR TRANSMITTING MECHANICAL VIBRATIONS TO FLOWABLE MEDIA

(71) Applicant: Dr. Hielscher GmbH, Teltow (DE)

(72) Inventors: Thomas Hielscher, Potsdam (DE); Holger Hielscher, Rangsdorf (DE); Harald Hielscher, Stahnsdorf (DE)

(73) Assignee: Dr. Hielscher GmbH, Teltow (DE)

( * ) Notice: Subject to any disclaimer, the term of this patent is extended or adjusted under 35 U.S.C. 154(b) by 824 days.

(21) Appl. No.: 18/299,402

(22) Filed: Apr. 12, 2023

(65) Prior Publication Data

US 2023/0294133 A1 Sep. 21, 2023

Related U.S. Application Data

(63) Continuation-in-part of application No. PCT/EP2021/076802, filed on Sep. 29, 2021.

(51) Int. Cl.

*B06B 1/06* (2006.01)
*B06B 1/08* (2006.01)
*B06B 3/02* (2006.01)
*G01N 29/34* (2006.01)

(Continued)

(52) U.S. Cl.

CPC .................. *B06B 3/02* (2013.01); *B06B 1/06* (2013.01); *B06B 1/0655* (2013.01); *B06B 1/08* (2013.01); *G01N 29/34* (2013.01); *H03H 9/15* (2013.01); *B06B 2201/55* (2013.01); *B06B 2201/58* (2013.01); *B06B 2201/70* (2013.01); *G01N 2009/006* (2013.01)

(58) Field of Classification Search

CPC . B05B 17/06; B05B 17/0607; B05B 17/0623; B06B 1/00; B06B 1/02; B06B 1/06; B06B 1/0607; B06B 1/0655; B06B 1/08; B06B 1/085; B06B 3/02; B06B 2201/55; B06B 2201/58; B06B 2201/70; G01N 9/002; G01N 2009/006; G01N 11/16; G01N 11/162; G01N 29/02; G01N 29/036; G01N 29/24; G01N 29/34; H03H 9/15

See application file for complete search history.

(56) References Cited

U.S. PATENT DOCUMENTS 3,666,974 A * 5/1972 Dostal ...................... G04C 3/12
318/132
4,337,896 A 7/1982 Berger et al.
4,537,511 A 8/1985 Frei (Continued)

FOREIGN PATENT DOCUMENTS

WO 2022078760 A1 4/2022

OTHER PUBLICATIONS

"International Search Report and Written Opinion" mailed on Jan. 17, 2022, for PCT Application No. PCT/EP2021/076802, 14 pages.

*Primary Examiner* — Levi Gannon
(74) *Attorney, Agent, or Firm* — Ashurst Perkins Coie US LLP; Colin Fowler

(57) ABSTRACT

The invention relates to a device for transmitting mechanical vibrations to flowable media. The device is characterized in that the normal amplitudes of the effective surface points of a resonator are substantially uniform during a resonant vibration, and an amplitude vector in the effective surface points of more than 50 percent of an effective surface is not substantially parallel to the normal vector of these effective surface points.

17 Claims, 1 Drawing Sheet

(51) Int. Cl.
*H03H 9/15* (2006.01)
*G01N 9/00* (2006.01)

(56) References Cited

U.S. PATENT DOCUMENTS

| | | | | |
|---|---|---|---|---|
| 10,871,432 | B1 * | 12/2020 | Haeusler .............. | G01N 11/162 |
| 11,125,668 | B2 * | 9/2021 | Goodbread .............. | G01N 9/34 |
| 11,781,961 | B1 * | 10/2023 | Goodbread .......... | G01N 29/036<br>73/32 A |
| 2013/0139576 | A1 * | 6/2013 | Goodbread ............ | G01N 11/16<br>73/64.53 |
| 2015/0314391 | A1 * | 11/2015 | Hielscher .................. | B06B 3/00<br>367/137 |
| 2019/0003947 | A1 | 1/2019 | Goodbread et al. | |
| 2019/0293825 | A1 | 9/2019 | Gonzalez et al. | |

* cited by examiner

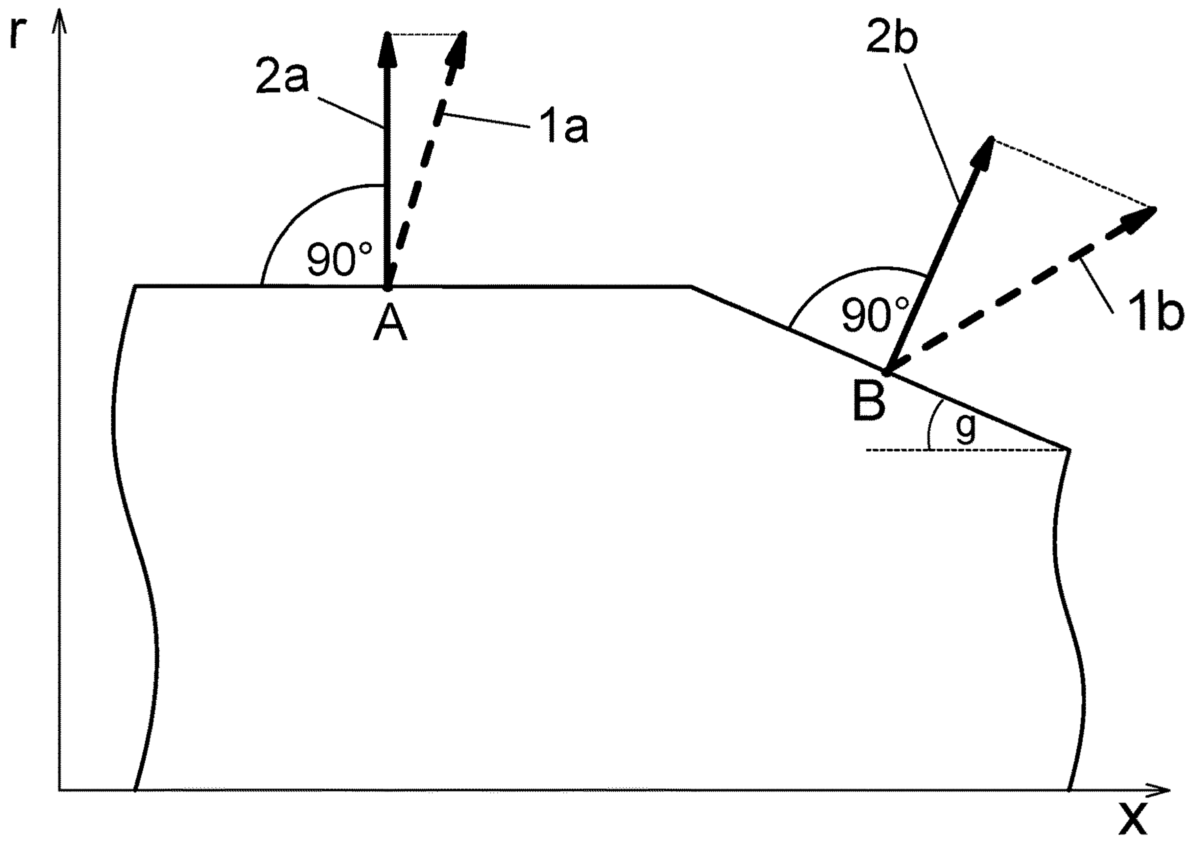
r
2a
1a
90°
A
2b
90°
1b
B
g
x

DEVICE FOR TRANSMITTING MECHANICAL VIBRATIONS TO FLOWABLE MEDIA

This is a continuation-in-part of international patent application no. PCT/EP2021/076802, filed on 29 Sep. 2021 under the Patent Cooperation Treaty (PCT), which claims priority to German patent application no. 10 2020 127025.9, filed on 14 Oct. 2020.

TECHNICAL FIELD

The invention relates to a device for transmitting mechanical vibrations to flowable media.

BACKGROUND

A resonator may be excited to resonant vibration at any surface point, several arbitrary surface points, or one or more partial surfaces. A resonator can have multiple resonant frequencies. The resonant frequency of a resonator may be affected by, among other things, the material, the geometry, and the temperature of the resonator and its contact with a flowable medium.

The mechanical power transmitted by a resonator via an effective surface to a flowable medium depends, among other things, on the properties of the flowable medium, such as temperature, viscosity or pressure, on the size of the effective surface and on the normal amplitude of the effective surface points.

BRIEF DESCRIPTION OF THE DRAWING

The various embodiments of the disclosure mentioned herein can be advantageously combined with each other, unless otherwise specified in the individual case. Various objects and advantages of the present disclosure will become apparent to those skilled in the art from the following detailed description of embodiments, when read in light of the accompanying drawing, in which:

The FIGURE schematically shows a cross section of a rotationally symmetrical resonator.

DETAILED DESCRIPTION

For some applications, a substantially uniform normal amplitude for all effective surface points is desirable.

Some resonators show a substantially uniform normal amplitude in segments of the effective surfaces, in which the amplitude vector of the effective surface points is substantially parallel to the normal vector of these effective surface points.

The invention is based on a device for transmitting mechanical vibrations to flowable media. The device can be characterized in that the normal amplitudes of the effective surface points of a resonator are substantially uniform during a resonant vibration and an amplitude vector in the effective surface points of more than 50 percent of an effective surface is not substantially parallel to the normal vector of those effective surface points.

The invention makes it possible to transmit vibrations with a substantially uniform effective amplitude over a large proportion of the resonator surface in contact with the flowable medium. The resonator is designed in such a way that, during a resonant vibration for a large portion of the effective surface of the resonator, the amplitude vector of the effective surface points is not substantially parallel to the normal vector of these effective surface points and that the resulting normal amplitude of the effective surface points is substantially uniform.

Furthermore, the embodiments a) to m) mentioned in the following paragraphs are preferred, in particular also in any combination of two or more of these embodiments:

a) The resonant vibration is in the range of 15 kilohertz to 60 kilohertz.

b) The resonator is substantially rod-shaped.

c) The resonator is rotationally symmetrical. The maximum diameter of the resonator is preferably between 30 millimeters and 120 millimeters.

d) The maximum of the amplitudes of the effective surface points of a resonator is between 1 and 100 micrometers.

e) The resonator consists of one part.

f) The resonator is made of a metallic material. Alternatively, the resonator can be made of a non-metallic material.

g) The effective surface of the resonator is 10 square centimeters to 4500 square centimeters.

h) The power transmitted from the resonator via the effective surface to a flowable medium by means of resonant mechanical vibrations ranges from 100 watts to 16000 watts.

i) The resonator is mechanically connected to a vibration exciter.

j) The resonator is mechanically connected to an electromechanical vibration exciter, which converts electrical vibrations piezoelectrically or magnetostrictively into mechanical vibrations.

k) The resonator is mechanically connected to another resonator.

l) More than 80 percent of the effective surface has a normal amplitude in a range from −20 percent to +20 percent about the mean value. Particularly preferably, more than 85 percent of the effective surface has a normal amplitude in a range from −15 percent to +15 percent about the mean value.

m) The amplitude vector of the effective surface points of more than 70 percent of the effective surface is not substantially parallel to the normal vector of these effective surface points. Preferably, the amplitude vector of the effective surface points of more than 80 percent of the effective surface is not substantially parallel to the normal vector of these effective surface points. Particularly preferably, the amplitude vector of the effective surface points of more than 90 percent of the effective surface is not substantially parallel to the normal vector of these effective surface points.

n) The part of the surface of the resonator limiting the resonator which is in contact with ambient air, coolant or compressed gas, shielding gas or inert gas is not considered part of the effective surface.

Definitions and Terminology

Flowable media (medium, media), are e.g. fluids, gases, liquids, melts, plasma or supercritical gases, liquid metals, dispersions, emulsions, cell suspensions, pastes, paints, polymers, resins and nanomaterials or mixtures of the aforementioned. Flowable media can have different viscosities from 0 centipoise to 300000000 centipoise, preferably from 0.1 centipoise to 1000000 centipoise, e.g. 200 centipoise.

Resonator point is an element of the resonator. The resonator is the set of all resonator points.

Surface point (resonator surface point) is a point which is located on the surface of the resonator limiting the resonator. The resonator surface area is the set of all resonator surface points. The resonator surface area can be from 0 square centimeters to 100000 square centimeters, preferably from 10 square centimeters to 5000 square centimeters, e.g. 1000 square centimeters.

Effective surface is that part of the surface of the resonator limiting the resonator which is in contact with a flowable medium or several flowable media. The effective surface can be from 0 square centimeters to 95000 square centimeters, preferably from 10 square centimeters to 4500 square centimeters, e.g. 950 square centimeters.

Effective surface point is a point located on that part of the resonator's surface limiting the resonator which is in contact with a flowable medium.

Effective power is the power transmitted from the resonator via the effective surface to a flowable medium by means of resonant mechanical vibrations. The effective power can be more than 1 watt, preferably 10 watts to 24000 watts, e.g. 4000 watts.

Vibrations are mechanical vibrations with a working frequency of 0.1 kilohertz to 100 kilohertz, preferably 15 kilohertz to 60 kilohertz, e.g. 20 kilohertz. During vibration, resonator points move regularly about a rest position.

Rest position (equilibrium position) is the position of all resonator points in the absence of vibrations.

Vibration deflection (excursion) indicates the instantaneous distance of a resonator point from its rest position. The vibration deflection for each surface point can be described by a combination of the deflection along the X, Y and Z axes.

Amplitude is the amount of the greatest possible distance of a resonator point from its rest position on the motion completed by this resonator point during deflection.

The position of a resonator point is given by its location vector (e.g. Cartesian coordinates).

$$r = \begin{pmatrix} x \\ y \\ z \end{pmatrix}$$

The amplitude vector of a resonator point is obtained by subtracting the position vector of the resonator point at rest from the position vector of the resonator point at the time of the greatest possible distance from its rest position.

A normal vector (normal vector) is a vector that is orthogonal (i.e. right-angled, vertical) to a straight line, curve, plane, (curved) surface, or a higher-dimensional generalization of such an object. The normal vector of a curved surface at a point is the normal vector of the tangent plane at that point. For the determination of the normal vector, curvatures, dents, profiles, indentations, elevations, grooves and pores, which result from the roughness of the surface (ra<200 μm), are to be neglected or smoothed.

The normal vector of a surface point is the normal vector of the resonator surface at that surface point.

The normal vector of an effective surface point is the normal vector of the resonator surface in this effective surface point.

Normal amplitude of a surface point is the amount of the largest possible distance of this surface point along the normal vector of this surface point on the movement made by this surface point during the deflection.

Normal amplitude of an effective surface point is the amount of the largest possible distance of this effective surface point along the normal vector of this effective surface point on the movement performed by this effective surface point during the deflection.

Two straight lines or vectors which have a small angle to each other, preferably an angle of 0 to 20 degrees, e.g. less than 12 degrees, are substantially parallel.

Substantially uniform are values which are to a large extent close to each other. Substantially uniform are preferably values of which more than 80 percent lie in a range of −20 percent to +20 percent around the mean. For example, substantially uniform are values of which more than 85 percent lie within a range of −15 percent to +15 percent around the mean value.

A resonator can be any mechanical structure. A resonator may be, among other things, rod-, ring-, bell-, plate-, beam-, cuboid-, cylinder-, sphere-, cube-, cone-, hollow cylinder-, polygon or plate-shaped, rotationally symmetrical or not rotationally symmetrical, preferably rod-, cylinder- or beam-shaped and rotationally symmetrical, e.g. rod-shaped and rotationally symmetrical to the longitudinal axis of the rod shape. The material of a resonator may be any, preferably solid or liquid, e.g., solid. Materials for a solid resonator may be, for example, metals, non-metals, crystals, plant products, such as wood, ceramics, glass, polymers, or composites, preferably metals, such as titanium alloys. A resonator may consist of one part or of a plurality of connected sub-components, preferably one or two parts, e.g., consisting of one part.

FIG. 1 schematically shows a cross section of a rotationally symmetrical resonator along a longitudinal axis x of the resonator. Specifically, the cross section corresponds to a view on a plane extending along the longitudinal axis x and a transversal axis r of the resonator.

The resonator may comprise a first effective surface with a plurality of first effective surface points, e.g. effective surface point A, and a second effective surface with a plurality of second effective surface points, e.g. effective surface point B. The first effective surface may be inclined to the second effective surface by an angle g. As shown in FIG. 1, the first effective surface may be arranged to be inclined to the second effective surface by the angle g with respect to or along the longitudinal axis x.

In the following description, the pluralities of first and second effective surface points are described with respect to the effective surface points A and B without being limited thereto. For example, only some or all of the effective surface points of the plurality of first and second effective surface points may be designed to correspond to the respective effective surface points A and B. The effective surface point A may comprise an amplitude vector 1*a* and a normal vector 2*a*. The effective surface point B may comprise an amplitude vector 1*b* and a normal vector 2*b*. The normal vectors 2*a* and 2*b* may be arranged orthogonally on the respective first and second effective surfaces. That is, the angle between the normal vector 2*a* and the first effective surface and the angle between the normal vector 2*b* and the first effective surface may each be of 90 degrees. The amplitude vector 1*a* of the effective surface point A may be arranged to be not in parallel to the normal vector 2*a* of the effective surface point A. The amplitude vector 1*b* of the effective surface point B may be arranged to be not in parallel to the normal vector 2*b* of the effective surface point B.

The angle g by which the second effective surface of the effective surface point B is inclined to the longitudinal axis (x) of the resonator may be selected in such a way that the normal amplitude of the effective surface point B corresponds to the normal amplitude of the effective surface point A. In other words, the normal amplitudes of the effective surface points A and B of the resonator are substantially uniform during a resonant vibration and the amplitude vectors in the effective surface points A and B are not substantially parallel to the normal vector of these effective surface points Due to the inclination (expressed by angle g) between the first effective surface and the second effective surface, the direction of the amplitude vector 1*a* differs from the direction of the amplitude vector 1*b*. The change in the direction and the amount thereof may be caused by the transformation of longitudinal oscillations into radial oscillations (and vice versa) along the longitudinal axis of the resonator. The superposition of longitudinal and radial oscillations may result in an amplitude vector which may be oriented completely radially with respect to the transversal axis r at the node of the longitudinal oscillation and completely longitudinally with respect to the longitudinal axis x at the maximum of the longitudinal oscillation. Accordingly, the amplitude and its vector may be varied by the resonator geometry, e.g., by the inclination between the first and second effective surfaces.

REFERENCE SYMBOLS

A effective surface point of first effective surface
B effective surface point of second effective surface
g angle between the first effective surface and the second effective surface
1*a* amplitude vector of effective surface point A
1*b* amplitude vector of effective surface point B
2*a* normal vector of effective surface point A
2*b* normal vector of effective surface point B

We claim:

1. A device for transmitting mechanical vibrations to flowable media, comprising a resonator representing the set of all resonator points of the device, wherein an effective surface of the resonator is the part of the surface of the resonator limiting the resonator which is in contact with a flowable medium, wherein an effective surface point is a point located on a part of the effective surface of the resonator, wherein a normal vector of an effective surface point is the normal vector of the resonator surface in this effective surface point, wherein a normal amplitude of an effective surface point is the amount of the largest possible distance of the effective surface point along the normal vector of the effective surface point on the movement performed by this effective surface point during the deflection of the resonator, and wherein an amplitude vector of a resonator point is obtained by subtracting the position vector of the resonator point at rest from the position vector of the resonator point at the time of the greatest possible distance from its rest position, characterized in that the maximum of the amplitudes along the effective surface points of the resonator is between 1 and 100 micrometers and the resonator is designed such that the normal amplitudes of the effective surface points of the resonator are substantially uniform during a resonant vibration of the resonator and an amplitude vector in the effective surface points of more than 50 percent of the effective surface of the resonator is not substantially parallel to the normal vector of the effective surface points.

2. The device of claim 1, wherein the resonant vibration is in the range of 15 kilohertz to 60 kilohertz.

3. The device of claim 1, wherein the resonator is substantially rod-shaped.

4. The device of claim 1, wherein the resonator is rotationally symmetric.

5. The device of claim 4, wherein the maximum diameter of the resonator is between 30 millimeters and 120 millimeters.

6. The device of claim 1, wherein the resonator consists of one part.

7. The device of claim 1, wherein the resonator is made of a metallic material.

8. The device of claim 1, wherein the effective surface of the resonator is 10 square centimeters to 4500 square centimeters.

9. The device of claim 1, wherein the power transmitted from the resonator via the effective surface to a flowable medium by means of resonant mechanical vibrations is 100 watts to 16000 watts.

10. The device of claim 1, wherein the resonator is mechanically connected to a vibration exciter.

11. The device of claim 1, wherein the resonator is mechanically connected to an electromechanical vibration exciter that piezoelectrically or magnetostrictively converts electrical vibrations into mechanical vibrations.

12. The device of claim 1, wherein the resonator is mechanically connected to another resonator.

13. The device of claim 1, wherein more than 80 percent of the effective surface has a normal amplitude in a range of −20 percent to +20 percent about the mean value.

14. The device of claim 1, wherein the amplitude vector of the effective surface points of more than 70 percent of the effective surface is not substantially parallel to the normal vector of these effective surface points.

15. The device of claim 1, wherein more than 85 percent of the effective surface has a normal amplitude in a range of −15 percent to +15 percent about the mean value.

16. The device of claim 1, wherein the amplitude vector of the effective surface points of more than 80 percent of the effective surface is not substantially parallel to the normal vector of these effective surface points.

17. The device of claim 1, wherein the amplitude vector of the effective surface points of more than 90 percent of the effective surface is not substantially parallel to the normal vector of these effective surface points.

* * * * *